(12) United States Patent
Schmalenberg

(10) Patent No.: US 11,879,980 B2
(45) Date of Patent: Jan. 23, 2024

(54) METHOD FOR ROAD DEBRIS DETECTION USING LOW-COST LIDAR

(71) Applicant: TOYOTA MOTOR ENGINEERING & MANUFACTURING NORTH AMERICA, INC., Plano, TX (US)

(72) Inventor: Paul D. Schmalenberg, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 679 days.

(21) Appl. No.: 16/908,708

(22) Filed: Jun. 22, 2020

(65) Prior Publication Data

US 2021/0396887 A1    Dec. 23, 2021

(51) Int. Cl.
| | |
|---|---|
| G01S 17/931 | (2020.01) |
| G01S 17/06 | (2006.01) |
| G01S 17/86 | (2020.01) |
| G01S 7/487 | (2006.01) |
| H01L 31/105 | (2006.01) |

(52) U.S. Cl.
CPC ............ *G01S 17/931* (2020.01); *G01S 7/487* (2013.01); *G01S 17/06* (2013.01); *G01S 17/86* (2020.01); *H01L 31/105* (2013.01)

(58) Field of Classification Search
CPC ................. G06V 20/00; G05D 1/0274; G05D 2201/0213; G05D 1/024; G01S 17/86; G01S 17/931; G01S 13/931; G01S 17/89; G01S 2013/9322; G01S 2013/932; B60W 2420/42; B60W 2420/52; B60W 40/06; G06T 2207/30252; G06T 2207/10028; G06T 2207/30256; B60R 21/0134; B60R 1/00

See application file for complete search history.

(56) References Cited

U.S. PATENT DOCUMENTS

| | | | | |
|---|---|---|---|---|
| 5,864,394 A | * | 1/1999 | Jordan, III | ........... G01R 31/308 |
| | | | | 356/394 |
| 9,383,753 B1 | * | 7/2016 | Templeton | .............. G01S 17/86 |
| 2014/0336842 A1 | * | 11/2014 | Jang | ........................ G06V 20/58 |
| | | | | 701/1 |

(Continued)

OTHER PUBLICATIONS

Riemensberger, Johann et al., "Massively parallel coherent laser ranging using soliton microcombs," found at https://arxiv.org/abs/1912.11374, and dated Dec. 27, 2019.

*Primary Examiner* — Jennifer D Bennett
(74) *Attorney, Agent, or Firm* — SHEPPARD, MULLIN, RICHTER & HAMPTON LLP; Hector A. Agdeppa; Daniel N. Yannuzzi

(57) ABSTRACT

Improved systems and methods are provided to implement anomaly detection. The method includes a FMCW LIDAR system that steers the laser beam of the LIDAR system via the wavelength tuning of a FMCW. The direction of the laser beam can be diffracted and controlled by the optical grating antennas which may diffract the laser beam as a function of wavelength. The method may also provide a LIDAR sensor with exhibits a controlled and wide-angle fill or output without the use of conventional mechanical mechanisms for scanning. The LIDAR system provides a cost-effective method to reduce scan dimensionality without sacrificing performance.

20 Claims, 8 Drawing Sheets

(56) References Cited

U.S. PATENT DOCUMENTS

| | | |
|---|---|---|
| 2017/0097414 A1 | 4/2017 | You |
| 2017/0155225 A1* | 6/2017 | Villeneuve .......... H01S 3/06758 |
| 2018/0045819 A1 | 2/2018 | Cornic |
| 2018/0107091 A1 | 4/2018 | Hosseini |
| 2018/0306925 A1 | 10/2018 | Hosseini |
| 2018/0364336 A1 | 12/2018 | Hosseini |
| 2019/0049584 A1* | 2/2019 | Schmalenberg ...... G01S 7/4817 |
| 2019/0129008 A1 | 5/2019 | Lin |
| 2019/0361096 A1 | 11/2019 | Popovich |
| 2021/0356588 A1* | 11/2021 | El Amili ............... G01S 7/4812 |

* cited by examiner

METHOD FOR ROAD DEBRIS DETECTION USING LOW-COST LIDAR

TECHNICAL FIELD

The presently disclosed technology relates generally to anomaly detection, and in particular, some implementations may relate to a light detection and ranging (LIDAR) system that operates with a frequency-modulated continuous-wave (FMCW) pattern for road debris detection.

DESCRIPTION OF RELATED ART

Light detection and ranging (LIDAR) is an optical perception technology that enables machines to see the world, make decisions, and navigate their surrounding environment. LIDAR is a detection system that uses light waves to determine the range, angle, and/or velocity of objects. LIDAR is analogous to RADAR except light signals instead of radio signals are the medium used to determine the range and/or velocity of targets. Specifically, LIDAR is a method for measuring distances (i.e., ranging) by illuminating the target with laser light and measuring the reflection with a sensor.

The technology landscape is cluttered with numerous options for every component in a LIDAR system. These components include the measurement process, emitter (e.g., laser), beam steering, and receiver (e.g., photodetector). The measurement processes comprise time-of-flight (TOF), random-modulation continuous-wave (RMCW), and frequency-modulated continuous-wave (FMCW). Only these concepts, only time-of-flight and frequency-modulated continuous-wave persist as viable options in automotive LIDAR. TOF LIDAR and FMCW LIDAR use differences in laser return times and frequency/wavelength to make 3-D representations of the target, respectively. TOF LIDAR requires lasers that output high-powered pulses to capture time differences while FMCW LIDAR can use tunable lasers that output a relatively low-powered continuous wave to capture frequency/wavelength differences.

Regarding automotive technologies, a transition from high-powered pulses/direct detection transceivers to frequency or wavelength modulated/coherent optical transceiver is emerging. FMCW LIDAR incorporates coherent transceivers that amplify only light coherent with the local oscillator signal of the transceiver while blocking noise from sunlight, artificial lights, or LIDARs on other vehicles. Specifically, coherent transceivers use narrow-linewidth lasers, high-speed modulators, and coherent receivers built into photonic integrated circuits (PICS) to achieve high throughput and long-distance detection. Additionally, PICS replace many free-space optical components with chip-scale solutions, thus providing a small form factor and solid-state beam steering. Furthermore, PICS or silicon photonics enable the integration of multiple optical circuits into a small optical IC for a small footprint and mass production capability.

The preceding integration of silicon photonics and FMCW LIDAR provide high resolution and instantaneous range and velocity measurements. The basic operation of FMCW LIDAR systems entail transmitting a light source with a continuous optical signal to a target and capturing the reflected optical signal at a coherent receiver for detection. The frequency of a tunable laser may be modulated to transmit a continuous wave signal beam with a varying frequency or wavelength over time. The signal beam may be fixed or scanned depending on the needs of the application and the associated costs. Regardless of the extent of the scanned environment, reflected signal beams are received, but only coherent light is combined with a local oscillator, which is detected with a photodetector (e.g., photodiode) of the coherent receiver. Thereafter, a transimpedance amplifier converts the photocurrent to a voltage that is processed to instantaneously determine the distance and velocity to the reflected target. This information may also be used to derive position and velocity of the transceiver or source. Ultimately, the associated accuracy and the resolution of the measurements make FMCW LIDAR a valuable tool that will increasingly be applied to long range 3D distance and velocimetry in autonomous driving.

BRIEF SUMMARY OF THE DISCLOSURE

The presently disclosed technology describes detecting an anomaly associated with a surface of a road using a LIDAR system that has an optical grating and can operate with a frequency-modulated continuous-wave (FMCW) pattern. A light that passes through the optical grating can be caused to diffract at an angle that is a function of a wavelength of the light. In some embodiments, the LIDAR system may be disposed or mounted on a vehicle. The FMCW pattern can be a continuous change in wavelength with respect to time for a particular range of wavelengths from a first wavelength to a second wavelength. Different wavelengths passing through the optical grating can be diffracted at different angles and can impinge upon and be reflected from different points away from the vehicle. A baseline graph or reference graph of received power or range profile with respect to distance can be produced for a road that is flat and can have a distribution with a linear slope from a greater received power, reflected from a nearer point associated with a longer wavelength, to a lesser received power reflected from a further point associated with a shorter wavelength. The anomaly may have an effect of producing an operational or measured response graph in which the distribution has a particular shape associated with the type of anomaly. The anomaly can be detected based on a comparison of the operational or measured response graph and the baseline or reference graph.

Embodiments of the presently disclosed technology provide a method for anomaly detection using a light detection and ranging (LIDAR) sensor comprising generating a wide-angle laser emission via an optical grating array; detecting a reflected signal of the wide-angle laser emission, wherein the detected wide-angle laser emission comprises a measured representation; retrieving a stored detected wide-angle laser emission, wherein the stored detected wide-angle laser emission comprises a baseline representation; comparing the measured representation to the baseline representation; and identifying an anomaly based on the comparison, the anomaly representing an impediment in a travel path.

Another embodiment of the presently disclosed technology teaches a system comprising: a light source configured to emit a beam of light, wherein the light source comprises a tunable output wavelength and a stable phase; a sensor configured to transmit the beam of light and detect a reflected beam of light, wherein the sensor comprises a photodetector and an optical grating array configured to diffract the beam of light based on a wavelength of the beam of light; a modulator configured to modulate the wavelength of the light source, wherein sets of different wavelength ranges are configured to be directed to the optical grating array and each set of different wavelength ranges corresponds to a steering angle; and a computing component configured to receive the detected beam of light, wherein the computing component processes the detected beam of light to identify an anomaly.

Further embodiments of the presently disclosed technology encompass a non-transitory machine-readable medium having instructions stored therein, which when executed by a processor, cause the processor to perform operations, the operations comprising: generating a baseline graph of received power with respect to distance of a flat road; generating an operational graph of received power with respect to distance of a flat road, wherein a linear slope of the baseline graph and the operational graph depict a distribution with a linear slope from a greater received power, reflected from a nearer point associated with a higher wavelength, to a lesser received power reflected from a further point associated with a lower wavelength; comparing the slope of the baseline graph and the slope of the operational graph, wherein the slope of the operational graph is different from the slope of the baseline graph; and identifying an anomaly based on the comparison of the operational graph to the baseline graph.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The presently disclosed technology, in accordance with one or more various embodiments, is described in detail with reference to the following figures. The figures are provided for purposes of illustration only and merely depict typical or example embodiments.

Figure 1:
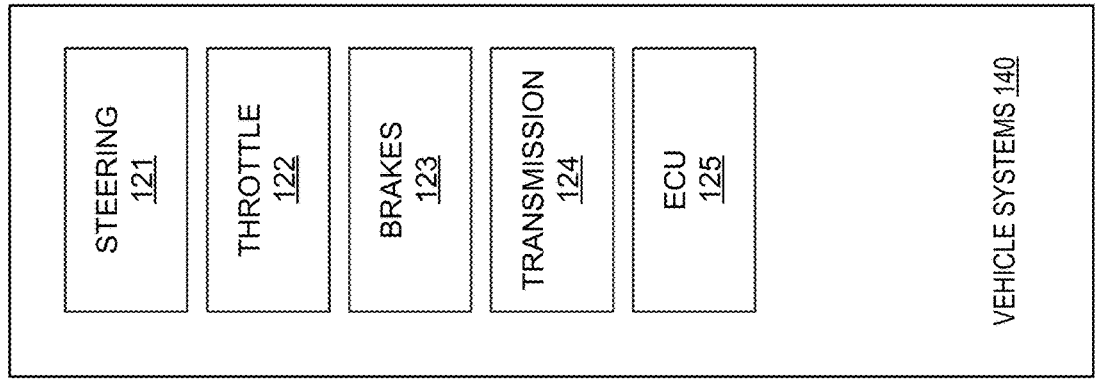
FIG. 1 illustrates an example autonomous or semi-autonomous vehicle with which embodiments of the disclosed technology may be implemented.
Figure 1:
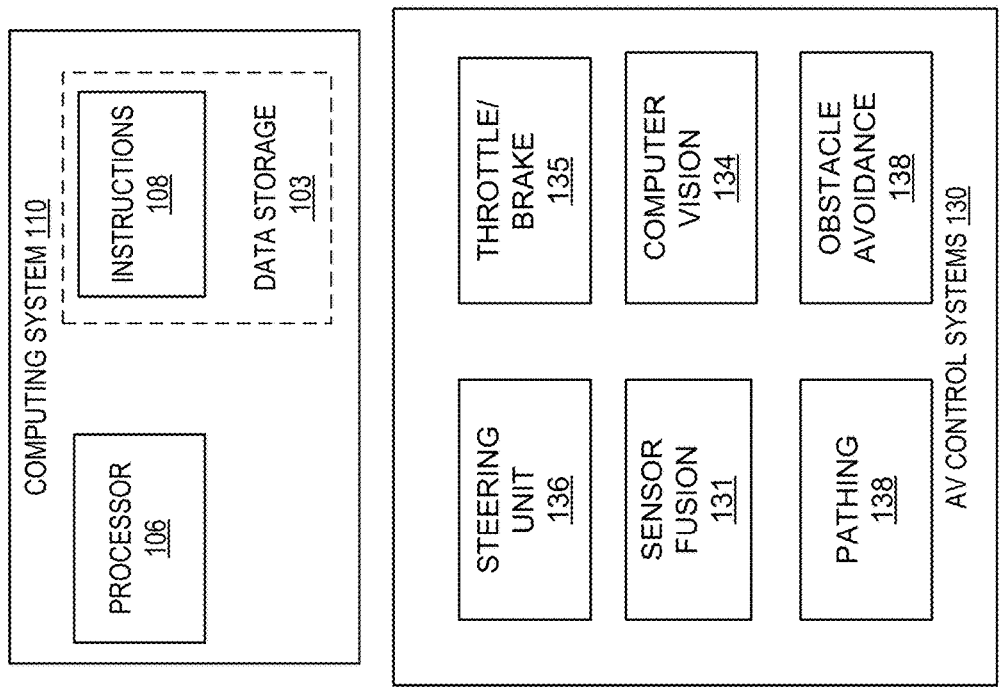
Figure 1:
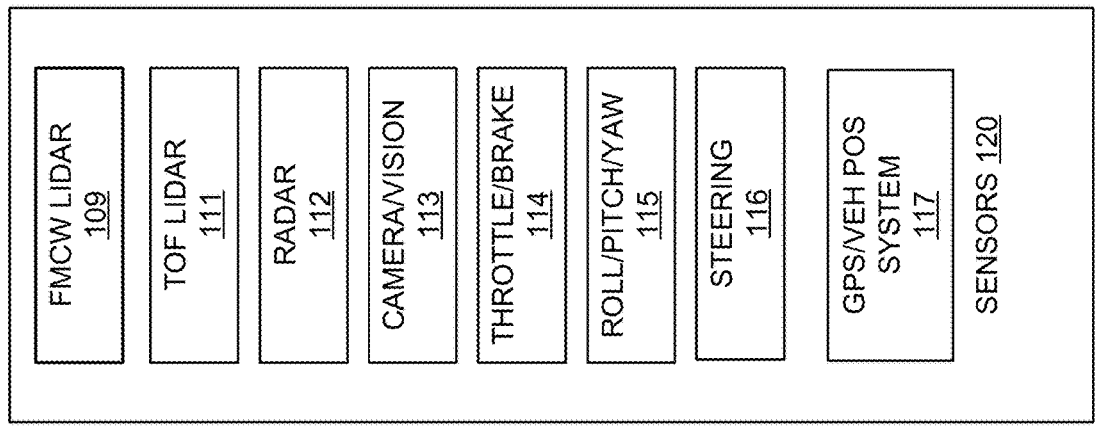

The figures are not exhaustive and do not limit the presently disclosed technology to the precise form disclosed.

DETAILED DESCRIPTION

Once only a futuristic possibility, semi-autonomous and autonomous vehicles are becoming reality due to advances in laser technology, photonics, and photodetection. Still, fully autonomous vehicles require an array of sensory systems to provide information about a vehicle's surroundings. LIDAR is one of the leading systems enabling these vehicles by providing the necessary high-resolution, 3D views refreshed at a standard video rate. For automotive applications, the light source often needs to be scanned or swept to obtain a comprehensive depiction of the surrounding environment of the vehicle. For example, vehicles either use multiple LIDARs and/or LIDARs configured to change their field of view. The latter situation requires some form of beam steering. Conventional approaches to beam steering fail to satisfactorily meet the increasing demands and performance standards in semi-autonomous and autonomous vehicles. Moreover, these approaches often require an extensive number of components to implement making detection expensive, bulky, and unduly complicated. As such, beam steering remains a real challenge that has yet to be resolved in the automotive community.

The current approaches for beam steering have various strengths and weaknesses. These approaches include mechanical platforms, MEMS mirror (driven oscillator), rotating multi-facet mirror, optical phased arrays, and flash illumination. To start, the simplest and operational approach to beam steering is mechanical. That is, a platform or gimbal rotates at a certain rate moving lasers 360 degrees. Each laser includes hardware for transmitting as well as receiving optical signals as it is being rotated on the platform. The concept of mechanical beam steering is simple and functional. However, mechanical mechanisms necessitate the use of moving parts that correspond to a higher likelihood of mechanical failures. Vehicles as well as integrated LIDAR systems are subject to dynamic accelerations and forces, which often increases the probability that moving parts will fail. Therefore, the automotive community desires a beam steering mechanism with as little motion as possible, and ideally no motion at all or static, to avoid the likelihood of mechanical failure.

The next type is a micro-electromechanical system (MEMS) device. A MEMS device is a miniature machine that has both mechanical and electronic components. For example, a MEMS mirror is a mirror that can oscillate around one or axes. The mirror is driven by electric or magnetic forces to oscillate at its resonance frequency. While effective, there is tradeoff between an ideal resonance frequency and diffraction. Additionally, when operating at resonance frequency it can be difficult to obtain a uniform scan. To obtain a uniform scan, a multi-facet mirror with six sides that are tilted may be used adding an additional level of complexity to the optical configuration of a MEMS mirror.

As to optical phased arrays, integrated pixels act like antennas in which light is fed through fibers to each pixel to control the phase and amplitude of the reemitted light. Optical phased arrays advantageously provide static beam steering and are thus deemed a "solid-state solution." Nevertheless, the performance is sub-optical for automotive purposes. That is, lacking a satisfactory max steering angle and beam width. Moreover, current optical phased arrays fail to be cost-effective due to the high power consumption relative to their level of performance Lastly, flash illumination is another solid-state solution (i.e., static) but requires burdensome levels of programming, a high peak laser power, and the issue of photon starvation. That is, as distance increases to targets, the surface brightness increases making the target field is more and more weakly illuminated. For example, beyond 50 meters, flash illumination starts to struggle due to increased noise from the surface brightness.

Thus, an improved beam steering technique that is static, cost-effective, and functional is desired. The presently disclosed technology fulfills this need by a solid-state solution (i.e., optical grating array) that is cost-effective (i.e., does not require high-powered laser and substantial power in detectors, also small form factor), and functional (i.e., wide-angle fill achieved through frequency or wavelength tuning of the optical grating array). Additionally, the corresponding signal processing of measurements provides an uncomplicated technique to determine an anomaly. This technique meets performance standards in vehicles, provides a straightforward application, and avoids extensive programming. Further, the proposed system and method can be implemented in existing FMCW LIDAR systems with nominal modifications to the beam steering hardware and associated software. Therefore, the presently disclosed technology can satisfy the requirements of beam steering in automotive technologies.

Throughout the instant disclosure, an anomaly may be defined as something that deviates from what is standard, normal, or, expected. The term is meant to be broadly construed to include a distribution that is not the same as a standard distribution. In one implementation, a standard distribution may be illustrated by a decreasing slope between a first (r') and a second (r") length on a FMCW power graph or range profile. This implementation depicts measurements obtained from a flat road or area(s) traversable by a vehicle without significant impediments thereon. Some examples of anomalies or impediments may include road debris, holes, objects, waste, litter, dip, cracked surfaces, ruts, barriers, speed bumps, construction, etc.

Further terms used throughout the instant disclosure include a representation of known or measured responses and may be referred to interchangeably as a plot, graph, and/or distribution of known or measured responses. A baseline representation may also be interpreted equivalently with a standard distribution, reference graph, and/or known responses. Similarly, a transformed or transformation representation may be interpreted equivalently with an operational graph, measured responses, and/or transformed distribution.

Embodiments of the presently disclosed technology provide FMCW LIDAR that detects anomalies in a path of an autonomous or semi-autonomous vehicle. In some embodiments, the autonomous or semi-autonomous vehicle may be moving or stationary while FMCW LIDAR is actively scanning a path. Furthermore, the disclosed FMCW LIDAR system is generally discussed as being implemented along with electronic devices such as robots, vehicles, and so on, however, it should be appreciated that the disclosed devices, systems, and methods can be integrated with the noted devices or can be provided as standalone sensors. Additionally, as used herein, a "vehicle" is any form of motorized transport. In one or more implementations, a vehicle refers to an automobile. While arrangements will be described herein with respect to automobiles, it will be understood that embodiments are not limited to automobiles. In some implementations, the vehicle may be any other form of motorized transport that, for example, benefits from data provided via the FMCW LIDAR system.

As alluded to above, FMCW LIDAR can also provide coherent detection. Coherent LIDAR is an optical version of the inexpensive FMCW coherent microwave radars now used as safety accessories in some vehicles. Coherence simplifies a complex process of determining the frequency characteristics of the reflected optical signal by knowing the frequency and phase difference of the transmitter when receiving an optical signal. Coherent detection is also much more sensitive than direct detection and offers better performance, including an instantaneous velocity and range measurement and immunity to interference from solar glare and other light sources such as LIDAR used by other vehicles.

As such, FMCW LIDAR provides a tremendous advantage in the field of object detection and tracking. Many features burdensome to measure may now be assessed. The presently disclosed technology incorporates the benefits of FMCW LIDAR and implements a method from measured responses of the FMCW LIDAR. The presently disclosed technology builds upon the characteristics of FMCW LIDAR to detect objects or anomalies in a previously uncontemplated way. In doing so, the application of FMCW LIDAR can remain effective, remove unnecessary components, and increase cost-effectiveness.

In various embodiments, the LIDAR makes use of a frequency-chirped modulated laser, in a homodyne configuration with a balanced detector. The chirped signal is transmitted to the target, and the delayed return signal is optically mixed in the detector to produce a beat frequency, which is proportional to the range to the target. The linear variation of frequency with time is referred to as a chirp, frequency sweep, or frequency ramp. The frequency sweep effectively places a time stamp on the transmitted signal at every instant, and the frequency difference between the transmitted signal and the signal returned from the target (i.e., the reflected or received signal) can be used to provide a measurement of the target range. The frequency difference may be interchangeably referred to as the beat frequency or intermediate frequency. Much higher detection sensitivity can be achieved using coherent optical mixing in both heterodyne and homodyne architecture/detection.

In one example, the beat frequency can be passed to a spectrum analyzer, which can be a bank of filters used to resolve targets into range bins. Spectrum analysis may be performed by an analog-to-digital converter (ADC) followed by a processor applying a Fast Fourier Transform (FFT). The frequency information can be extracted using a FFT in which the output of the spectrum analyzer for a single target can be a function centered at the target beat frequency. In one or more embodiments, further signal processing after the extraction of frequency information may include convolving a waveform of the known or ideal response with a waveform of the measured response. Alternatively, the waveforms may undergo cross-correlation or cross-covariance to find a correlation coefficient to indicate a measure of similarity between various waveforms of known and measured responses. The output of the comparison between waveforms of known and measures responses may be evaluated against a threshold indicating a level of similarity or dissimilarity between waveforms. For example, the values range between −1 (negative correlation) and 1 (positive correlation) and the threshold for an anomaly may be above −0.2 but below 0.2 which indicates a minimal or de minimis correlation between responses. If a calculated correlation coefficient falls in that range (i.e., −0.2 to 0.2), then an anomaly may be present in the measured response. Further techniques known in the art may be applied in the comparison between waveforms such as dynamic time warping, the phi coefficient, the Bhattacharyya distance, the Spearman coefficient and the Root Mean Square Deviation.

In further embodiments, the processed results may include a FMCW power graph or spectrum analysis. Received power graphs are more commonly referred to as range profiles, where the x-axis indicates range (meter) and the y-axis is the received power or magnitude. The relationship between the received power and range may indicate obstacles in the direct path of the vehicle. The processed results can be obtained from a wide angle fill scan of a FMCW LIDAR and may also provide a particular or baseline distribution of flat roads without anomalies. In various embodiments, the baseline distribution is a gradually decreasing slope within an associated range of the LIDAR scan. Thus, deviations from the baseline or reference graph reveal anomalies within an associated range of LIDAR scan. Stated differently, anything that causes a change in the gradually decreasing slope of the processed results of a LIDAR scan indicates an anomaly on the road.

Some embodiments provide a wavelength tunable LIDAR that uses an FMCW pattern that maps to a continuous change in wavelength with respect to time for a particular range of wavelengths. The continuous change may occur between a first wavelength and a second wavelength. Some embodiments provide segments of different wavelengths that are mapped to a tuner that controls the steering of an optical grating array. The optical grating array may steer or sweep a range of wavelengths to cover an entire segment of road. In doing so, anomalies in the path of the vehicle may be detected in a simple and efficient manner. One embodiment provides comparing the received power of several waveforms. wherein the received power can be dependent upon the range, wavelength or frequency, and power transmitted.

Further related technologies include a LIDAR systems and associated circuitry described in U.S. Pat. No. 10,274,599 filed on Jun. 1, 2016 and entitled "LIDAR systems with expanded fields of view on a planar substrate," which is incorporated herein by reference in its entirety. This patent discloses an example of a LIDAR system that includes laser scan transceiver chips with a processor and electronic components configured to steer a laser beam, a frequency tuner, and an array of antennas. The frequency tuner may modulate or modify the laser beam to have a particular frequency and a wavelength based upon the desired application. As such, U.S. Pat. No. 10,274,599 provides further details regarding the incorporation of a frequency tuner with photonic integrated circuitry.

In one or more implementations, the FMCW signal may be broken into time periods from $T_0$ to $T_N$. Optical grating antennas can be used to enable the different range of wavelengths to correspond with particular time periods and different steering angle. For example, a LIDAR grating array that can emit a different range of wavelengths for each time period. The different ranges of wavelengths may increase or decrease over a measurement duration. For example, $T_0$ to $T_1$ may have a particular range of increasing wavelengths, then $T_1$ to $T_2$ may have a particular range of increasing wavelengths, then $T_2$ to $T_3$ may have a particular range of increasing wavelengths, and so on until $T_N$ which can include 100s or even 1000s of time periods. The optical grating may provide different steering angles for each different range of wavelength corresponding to each time period. Thus, a wide-angle fill is possible when all time periods and different wavelengths are integrated during the complete scan of the FMCW beam.

Alternative embodiments may include a laser source (e.g., DFB laser) kept on as long as desired to effectively provide a continuous wave signal beam. The frequency of the laser source may be modulated by varying the injection current, using a frequency tuner, or other electronic circuitry. Regardless, frequency modulating the continuous wave signal beam in combination with an optical grating array will control the direct of the signal. Other techniques, such as amplitude modulation, polarization modulation, and phase modulation may also be applicable.

Several embodiments of the presently disclosed technology can be directed to a cost-effective solution through photonic integrated circuitry and a grating array to route an optical signal. The photonic integrated circuitry can be packaged and may comprise an optical source (e.g., tunable laser), waveguide, optical grating antennas, wavelength tuner, transmitter circuit, and receiver circuit. In various embodiments, the presently disclosed technology may use a FMCW pattern that is a continuous change in wavelength with respect to time for a particular wavelength. A beam or optical signal may be passed through an optical grating array or antennas to steer the optical signal as a function of the wavelength of the emitted optical signal. That is, different wavelengths passing through the optical grating array can be diffracted at different angles and can impinge upon and be reflected from different points away from the vehicle.

In one example of the presently disclosed technology, signal processing may include calculating a baseline graph of received power with respect to distance for a road that is flat. The baseline graph can depict a distribution with a linear slope from a greater received power, reflected from a nearer point associated with a higher wavelength, and a lesser received power reflected from a further point associated with a lower wavelength.

In some embodiments, the LIDAR system can be coupled to an optical grating array, such as the optical grating structures as described in detail in U.S. Patent Publication No. 2019/0049584 filed on Aug. 11, 2018 and entitled "2d photonic grating," which is incorporated herein by reference in its entirety. Accordingly, the output of the LIDAR system may then be effectively communicated to the surrounding environment, via grating antennas, to guide associated optical signals to various locations on the road. In one implementation, the grating array may be formed by periodically notching an on-chip photonic waveguide to create a diffraction grating such that light that is diffracted off the rulings will constructively interfere toward a desired direction. A diffraction period or width of each ruling can be chosen such that scattering from individual rulings constructively interferes at a desired angle.

The systems and methods disclosed herein may be implemented for use in long range 3D distance, velocimetry in autonomous vehicles and other automated technologies, and object tracking/detection. In the case of autonomous vehicles, embodiments may be implemented for any of a number of different autonomous or semi-autonomous vehicles and vehicle types to perform anomaly detection for surrounding objects or for the host (ego) vehicle itself. For example, the systems and methods disclosed herein may be used with cars, trucks, buses, construction vehicles and other on- and off-road vehicles. These can include vehicles for transportation of people/personnel, materials or other items. In addition, the technology disclosed herein may also extend to other vehicle types as well. An example Autonomous Vehicle (AV) in which embodiments of the disclosed technology may be implemented is illustrated in FIG. 1.

FIG. 1 illustrates an example autonomous or semi-autonomous vehicle with which embodiments of the disclosed technology may be implemented. In this example, vehicle 100 includes a computing system 110, sensors 120, AV control systems, 130 and vehicle systems 140. Vehicle 100 may include a greater or fewer quantity of systems and subsystems and each could include multiple elements. Accordingly, one or more of the functions of the technology disclosed herein may be divided into additional functional or physical components, or combined into fewer functional or physical components. Additionally, although the systems and subsystems illustrated in FIG. 1 are shown as being partitioned in a particular way, the functions of vehicle 100 can be partitioned in other ways. For example, various vehicle systems and subsystems can be combined in different ways to share functionality.

Sensors 120 may include a plurality of different sensors to gather data regarding vehicle 100, its operator, its operation and its surrounding environment. In this example, sensors 120 include frequency-modulated continuous-wave (FMCW) LIDAR 109, time-of-flight (TOF) LIDAR 111, radar 112, or other like the distance measurement sensors, image sensors 113, throttle and brake sensors 114, 3D accelerometers 115, steering sensors 116, and a GPS or other vehicle positioning system 117. One or more of the sensors 120 may gather data and send that data to the vehicle ECU or other processing unit. Sensors 120 (and other vehicle components) may be duplicated for redundancy.

Distance measuring sensors such as FMCW LIDAR 109, TOF LIDAR 111, radar 112, IR sensors and other like sensors can be used to gather data to measure distances and closing rates to various external objects such as other vehicles, traffic signs, pedestrians, light poles and other objects. Image sensors 113 can include one or more cameras or other image sensors to capture images of the environment around the vehicle as well as internal to the vehicle. Information from image sensors 113 can be used to determine information about the environment surrounding the vehicle 100 including, for example, information regarding other objects surrounding vehicle 100. For example, image sensors 113 may be able to recognize landmarks or other features (including, e.g., street signs, traffic lights, etc.), slope of the road, lines on the road, curbs, objects to be avoided (e.g., other vehicles, pedestrians, bicyclists, etc.) and other landmarks or features. Information from image sensors 113 can be used in conjunction with other information such as map data or information from positioning system 117 to determine, refined or verify vehicle location.

Throttle and brake sensors 114 can be used to gather data regarding throttle and brake application by a human or autonomous operator. Accelerometers 115 may include a 3D accelerometer to measure roll, pitch and yaw of the vehicle. Accelerometers 115 may include any combination of accelerometers and gyroscopes for the vehicle or any of a number of systems or subsystems within the vehicle to sense position and orientation changes based on inertia.

Steering sensors 116 (e.g., such as a steering angle sensor) can be included to gather data regarding steering input for the vehicle by a human or autonomous operator. A steering sensor may include a position encoder monitor the angle of the steering input in degrees. Analog sensors may collect voltage differences that can be used to determine information about the angle and turn direction, while digital sensors may use an LED or other light source to detect the angle of the steering input. A steering sensor may also provide information on how rapidly the steering wheel is being turned. A steering wheel being turned quickly is generally normal during low-vehicle-speed operation and generally unusual at highway speeds. If the driver is turning the wheel at a fast rate while driving at highway speeds the vehicle computing system may interpret that as an indication that the vehicle is out of control. Steering sensors 116 may also include a steering torque sensor to detect an amount of force the driver is applying to the steering wheel.

Vehicle positioning system 117 (e.g., GPS or other positioning system) can be used to gather position information about a current location of the vehicle as well as other positioning or navigation information.

Although not illustrated, other sensors 120 may be provided as well. Various sensors 120 may be used to provide input to computing system 110 and other systems of vehicle 100 so that the systems have information useful to operate in an autonomous, semi-autonomous or manual mode.

AV control systems 130 may include a plurality of different systems/subsystems to control operation of vehicle 100. In this example, AV control systems 130 include steering unit 136, throttle and brake control unit 135, sensor fusion component 131, computer vision component 134, pathing component 138, and obstacle avoidance component 139. Sensor fusion component 131 can be included to evaluate data from a plurality of sensors, including sensors 120. Sensor fusion component 131 may use computing system 110 or its own computing system to execute algorithms to assess inputs from the various sensors. the vehicle control system 204 may also perform signal processing of signals received from one or more sensors 236, 242. For example, signal processing may include estimation of a measured parameter from a single sensor, such as multiple measurements of a range state parameter from the vehicle 104 to an obstacle, and/or the estimation, blending, or fusion of a measured state parameter from multiple sensors such as multiple radar sensors or a combination of a FMCW LIDAR range sensor and a TOF LIDAR sensor. Signal processing of such sensor signal measurements may comprise stochastic signal processing, adaptive signal processing, and/or other signal processing techniques known to those skilled in the art.

Throttle and brake control unit 135 can be used to control actuation of throttle and braking mechanisms of the vehicle to accelerate, slow down, stop or otherwise adjust the speed of the vehicle. For example, the throttle unit can control the operating speed of the engine or motor used to provide motive power for the vehicle. Likewise, the brake unit can be used to actuate brakes (e.g., disk, drum, etc.) or engage regenerative braking (e.g., such as in a hybrid or electric vehicle) to slow or stop the vehicle.

Steering unit 136 may include any of a number of different mechanisms to control or alter the heading of the vehicle. For example, steering unit 136 may include the appropriate control mechanisms to adjust the orientation of the front or rear wheels of the vehicle to accomplish changes in direction of the vehicle during operation. Electronic, hydraulic, mechanical or other steering mechanisms may be controlled by steering unit 136.

Computer vision component 134 may be included to process image data (e.g., image data captured from image sensors 113, or other image data) to evaluate the environment within or surrounding the vehicle. For example, algorithms operating as part of computer vision component 134 can evaluate still or moving images to determine features and landmarks (e.g., road signs, traffic lights, lane markings and other road boundaries, etc.), obstacles (e.g., pedestrians, bicyclists, other vehicles, other obstructions in the path of the subject vehicle) and other objects. The system can include video tracking and other algorithms to recognize objects such as the foregoing, estimate their speed, map the surroundings, and so on.

Pathing component 138 may be included to compute a desired path for vehicle 100 based on input from various other sensors and systems. For example, pathing component 138 can use information from positioning system 117, sensor fusion component 131, computer vision component 134, obstacle avoidance component 139 (described below) and other systems to determine a safe path to navigate the vehicle along a segment of a desired route. Pathing component 138 may also be configured to dynamically update the vehicle path as real-time information is received from sensors 120 and other control systems 130.

Obstacle avoidance component 139 can be included to determine control inputs necessary to avoid obstacles detected by sensors 120 or AV control systems 130. Obstacle avoidance component 139 can work in conjunction with pathing component 138 to determine an appropriate path to avoid a detected obstacle.

Vehicle systems 140 may include a plurality of different systems/subsystems to control operation of vehicle 100. In this example, AV control systems 130 include steering system 121, throttle system 122, brakes 123, transmission went 24, electronic control unit (ECU) 125 and propulsion system 126. These vehicle systems 140 may be controlled by AV control systems 130 in autonomous, semi-autonomous or manual mode. For example, in autonomous or semi-autonomous mode, AV control systems 130, alone or in conjunction with other systems, can control vehicle systems 140 to operate the vehicle in a fully or semi-autonomous fashion. This may also include an assist mode in which the vehicle takes over partial control or activates ADAS controls to assist the driver with vehicle operation.

Computing system 110 in the illustrated example includes a processor 106, and memory 103. Some or all of the functions of vehicle 100 may be controlled by computing system 110. Processor 106 can include one or more GPUs, CPUs, microprocessors or any other suitable processing system. Processor 106 may include one or more single core or multicore processors. Processor 106 executes instructions 108 stored in a non-transitory computer readable medium, such as memory 103.

Memory 103 may contain instructions (e.g., program logic) executable by processor 106 to execute various functions of vehicle 100, including those of vehicle systems and subsystems. Memory 103 may contain additional instructions as well, including instructions to transmit data to, receive data from, interact with, and/or control one or more of the sensors 120, AV control systems, 130 and vehicle systems 140. In addition to the instructions, memory 103 may store data and other information used by the vehicle and its systems and subsystems for operation, including operation of vehicle 100 in the autonomous, semi-autonomous or manual modes.

Although one computing system 110 is illustrated in FIG. 1, in various embodiments multiple computing systems 110 can be included. Additionally, one or more systems and subsystems of vehicle 100 can include its own dedicated or shared computing system 110, or a variant thereof. Accordingly, although computing system 110 is illustrated as a discrete computing system, this is for ease of illustration only, and computing system 110 can be distributed among various vehicle systems or components.

Vehicle 100 may also include a wireless communication system (not illustrated) to communicate with other vehicles, infrastructure elements, cloud components and other external entities using any of a number of communication protocols including, for example, V2V, V2I and V2X protocols. Such a wireless communication system may allow vehicle 100 to receive information from other objects including, for example, map data, data regarding infrastructure elements, data regarding operation and intention of surrounding vehicles, and so on. A wireless communication system may also allow vehicle 100 to transmit information to other objects. In some applications, computing functions for various embodiments disclosed herein may be performed entirely on computing system 110, distributed among two or more computing systems 110 of vehicle 100, performed on a cloud-based platform, performed on an edge-based platform, or performed on a combination of the foregoing.

The example of FIG. 1 is provided for illustration purposes only as one example of vehicle systems with which embodiments of the disclosed technology may be implemented. One of ordinary skill in the art reading this description will understand how the disclosed embodiments can be implemented with this and other vehicle platforms.

Embodiments for deep learning for image perception utilize synthetic data, such as data generated programmatically. Synthetic data may include computer-generated data created to mimic real data. Embodiments may be implemented to disentangle the components of the data set, and perform multiple iterations.

Figure 2:
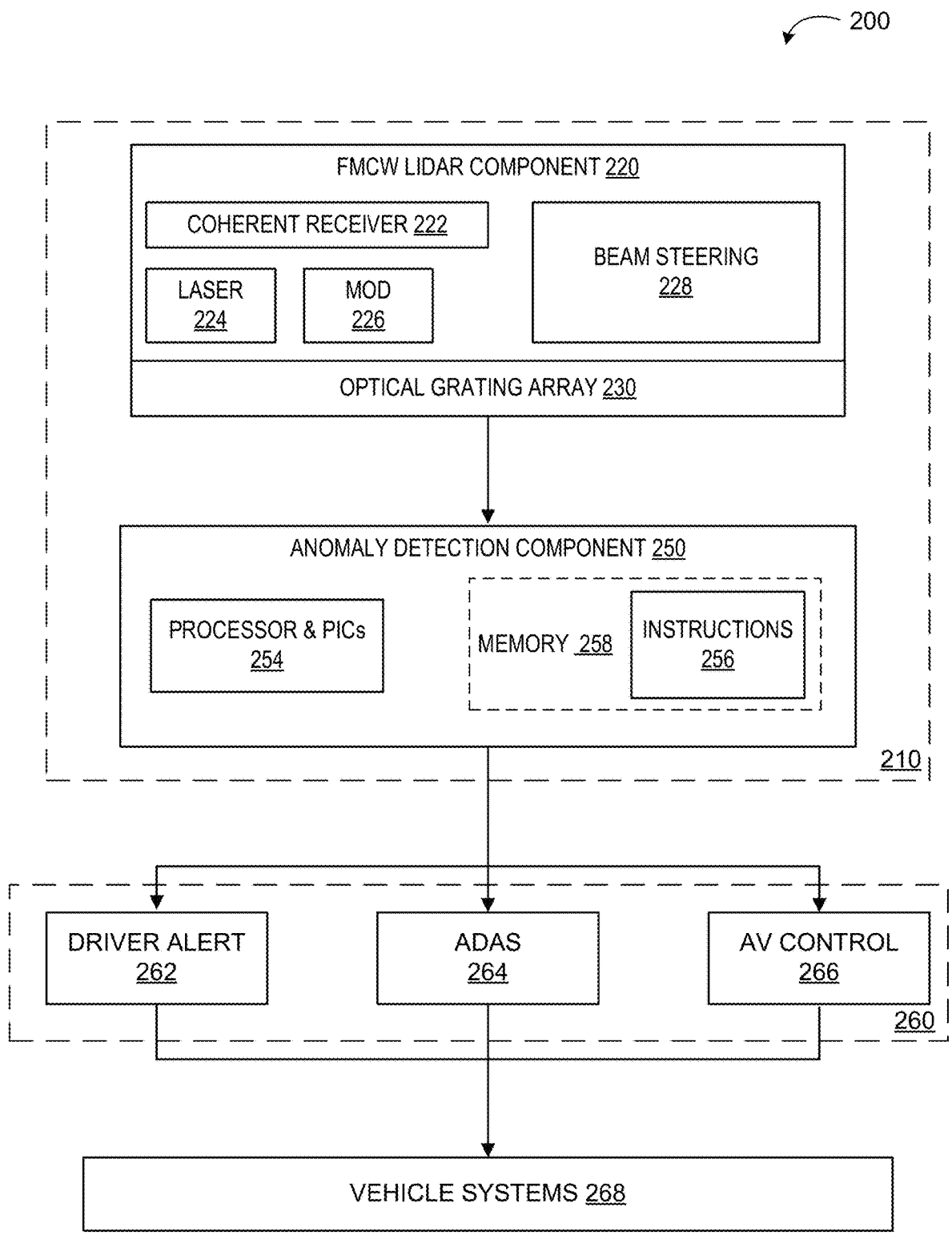
FIG. 2 illustrates an example system for anomaly detection in accordance with various embodiments of the systems and methods disclosed herein.

FIG. 2 illustrates an example system for anomaly detection in accordance with various embodiments of the systems and methods disclosed herein. Referring now to FIG. 2, the example system 200 includes LIDAR system 210 which may include a FMCW LIDAR Component 220, coherent receiver 222, Light source or laser 224, modulator 226, beam steering 228, and an optical grating array 230, an anomaly detection component 250, vehicle control components 260, and vehicle systems 268. LIDAR system 210 includes light emitters 224 and detectors 222 to collect information surrounding the vehicle (or other robotics or automated system). In operation, LIDAR system 210 generates light beams, such as laser light beams, that are emitted in wideband towards the front of the vehicle. The transmitted light is reflected by anomalies or objects in the path of the vehicle and the reflected light returns to LIDAR system 210 where they are captured by photodetectors 222. The reflections are converted into electrical signals by any array of photodetectors, which can be implemented as photodiodes, avalanche photodiodes or other photodetector systems. Notably, the use of avalanche photodiodes is not necessary since the LO amplifies the received reflected light. That is, the FMCW systems does not require photodetectors with intrinsic gain. As such, additional cost-saving may be achieved using only PIN silicon detectors or photodiodes, which is a photodiode with an intrinsic (i.e., undoped) region in between the n- and p-doped region. Timing information can be used by the TOF LIDAR 111 to measure the time-of-flight of the optical signal from its source LIDAR system 210 to the object, of which it bounces off and back to a photodetector where its reflection is received. This photodetector requires intrinsic gain due to the backscattered light impacting the Signal-to-Noise of the reflected signal. This time-of-flight can be used to measure the distance from the vehicle (from LIDAR system 210) to the object. LIDAR system 210 can be implemented using any of a number of different LIDAR technologies (e.g., FMCW 109 and TOF 111) including beam steering techniques. LIDAR system 210 can be implemented and configured to provide the system with anomaly detection using FMCW and TOF technologies. LIDAR system 210 can be implemented with a relatively high degree of accuracy (e.g., on the order of ±2 centimeters). While TOF and FMCW LIDAR types may be used, each LIDAR type has distinct and discrete measurement processes and associated hardware that may or may not be used together during sensor fusion and/or redundancy purposes.

Data from LIDAR system 210 can be used to generate waveforms illustrated in baseline or reference and operational or received power or range graphs that can be used by the autonomous vehicle or other robotic or automated system to navigate its surrounding environment. The FMCW LIDAR system can provide information to determine the presence and location of surrounding vehicles, pedestrians and other objects, road condition, and so on. In addition to detecting the presence and location of objects, information from LIDAR system 210 can also be used to track obstacles and other objects like vehicles, pedestrians, and so on.

Data from LIDAR system 210 can be supplied to processor 254 which can include a processing system or photonic integrated circuits (PICS) implemented to generate baseline and operational graphs or plots from the data collected from sensors and/or FMCW LIDAR system. The processing system may include electronics, firmware, control and driver integrated circuits, and/or digital signal processing unit. The graphs can comprise measured and reference roads with and without anomalies. The data may be collected without the use of flash LIDAR and mechanical actuation scanning processes such as, spinning mirrors, moving lasers, rotating lens, prisms, etc. This data can include image sensor data from an array of image sensors at LIDAR system 210 as well as frequency data. The information can be collected from the image sensors to generate the baseline and operational graphs for anomaly detection. For example, the anomaly detection component may transform the measured image data to a frequency domain for further processing. The transformation may be implemented by a Fast Fourier Transform and produce a unique graph if an anomaly is present in the path. Further techniques include, deep learning algorithms can be trained and used to label image data collected by the LIDAR system 210. The baseline and operational graphs can be stored in any of a number of different file formats for easy access and retrieval.

In operation, reflected optical signals from the environment are provided to anomaly estimation component. In this example, anomaly detection component 250 includes a processor 254 and memory 258. Processor 254 can include one or more GPUs, CPUs, microprocessors or any other suitable processing system. Processor 254 may include one or more single core or multicore processors. Processor 254 executes instructions 256 stored in a non-transitory computer readable medium, such as memory 258.

Memory 258 may contain data as well as instructions (e.g., program logic) executable by processor 254 to perform anomaly detection. These instructions may also include instructions 256 to execute various functions of vehicle 100, including those of vehicle systems and subsystems. Memory 258 may contain additional instructions 256 as well, including instructions to transmit data to, receive data from, interact with, and/or control one or more of the sensors 120, AV control systems, 130 and vehicle systems 140. In addition to the instructions, memory 258 may store data and other information used by the vehicle and its systems and subsystems for operation, including operation of vehicle 100 in the autonomous, semi-autonomous or manual modes.

Although one anomaly detection component 250 is illustrated in FIG. 2, in various embodiments anomaly detections 250 can be included. In some embodiments, some or all of the functions of anomaly detection 250 may be implemented using a vehicle processing unit including, for example, an ECU or computing system 110.

Instructions 256 in memory 258 can be included to cause processor 254 to detect an anomaly using the measured responses. Particularly, in one embodiment, the measured response may be convolved to differentiate the slope of the measured waveforms. Convolution is a mathematical operation on two functions that produces a third function expressing how the shape of one is modified by the other. Convolution is an integral that expresses the amount of overlap of one function as it is shifted over another function. Fourier transform techniques can be used to perform correlations and convolutions with increased computational efficiency. a convolution process is maybe ONE tool (or mathematical manipulation process) for seeing if there is any degree of relation or similarity (aka correlation) between data sets A computing component may compare the results of the convolution is a particular threshold to see if the threshold is surpassed. Other technique such as machine learning, and wavelet analysis may be used to determine the change in slope and the corresponding type of anomaly. For every position, we calculate the area of the intersection between f and reversed g. That intersection area is the convolution value at that specific position. In signal processing, cross-correlation is a measure of similarity of two series as a function of the displacement of one relative to the other.

The output of anomaly detection component 250 can include information for one or more objects surrounding the vehicle. This information can include, for example, velocity and trajectory information for other vehicles, pedestrians, and other objects around which the subject vehicle intends to navigate. This anomaly detection information can be provided to one or more of a number of vehicle control components 260 for vehicle control.

The information generated by anomaly detection 250 may be used by any of a number of vehicle systems such as for autonomous driving, obstacle avoidance, assisted driving, driver warnings or other alerts, and so on. The information in this example are provided to various vehicle control components 260 that can control the vehicle fully or partially in the can provide appropriate warnings and alerts to the driver. For example, in terms of the example vehicle described with reference to FIG. 1, this information can be provided to computing system 110 for routing, obstacle avoidance, assisted driving, and other functions.

In the illustrated example, include autonomous vehicle (AV) control component 266, advanced driver assistance systems (ADAS) component 264 and driver alert component 262. In other embodiments, other vehicle control components 260 may be included. Autonomous vehicle control component 266 can use the estimated anomaly information to operate the vehicle to avoid detected objects based on the received responses (e.g., given their estimated velocity and trajectory). This can include operating vehicle systems 268 such as throttle, steering and braking systems. ADAS component 264 can use the information for ADAS assistance systems available on a given vehicle to execute ADAS maneuvers depending on the anomaly information. For example, ADAS component 264 can provide instructions to a vehicle braking system of vehicle systems 268 to initiate emergency braking to avoid a collision with an object. As another example, ADAS component 264 can provide instructions to a steering system to execute object avoidance maneuvers.

Anomaly detection component 250 may also activate driver alert component 262 to provide one or more alerts to the driver of the subject vehicle. These alerts may include, for example, audible, visual or tactile alerts to provide alerts, data or other information to the driver in response to the anomaly detection information. This information might include, for example, an alert to the driver of a wrong way vehicle, a vehicle on a collision course with the subject vehicle or other condition of which the driver of the subject vehicle should be aware.

Figure 3:
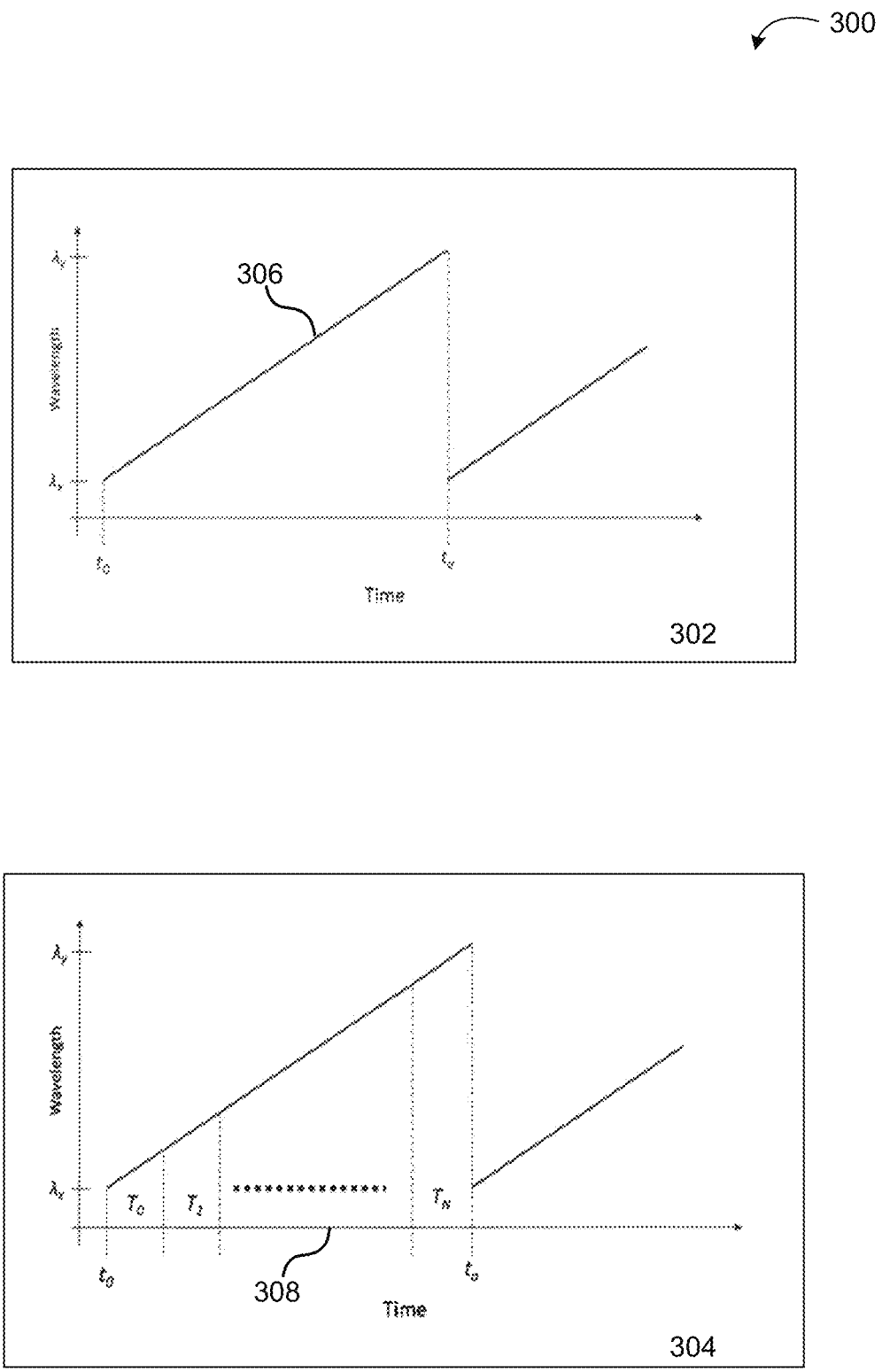
FIG. 3 illustrates an example FMCW signal in accordance with various embodiments of the systems and methods disclosed herein.

FIG. 3 illustrates an example FMCW signal 300 in accordance with various embodiments of the systems and methods disclosed herein. With reference now to FIG. 3, graphs 302 and 304 show an FMCW beam or signal that sweeps in a linear fashion from a first wavelength ($\lambda_x$) to a second wavelength ($\lambda_y$) as a function of time. Based on the slope, range and/or velocity may be retrieved from a target. The number of linear slopes may include more than one to improve the range and/or velocity estimation. The presently disclosed technology can I divide the slope into several segments representing different time periods as shown in graph 304. Graph 304 provides each time period can be associated with different wavelength ranges by using the grating antenna 402 illustrated in FIG. 4. Furthermore, this association may correspond with different steering angles. As such, the tuning used for FMCW detection may also provide the tuning for steering or controlling the LIDAR beam. In various embodiments, the number of time periods (N) may be more than 100 or even over a 1000.

Figure 4:
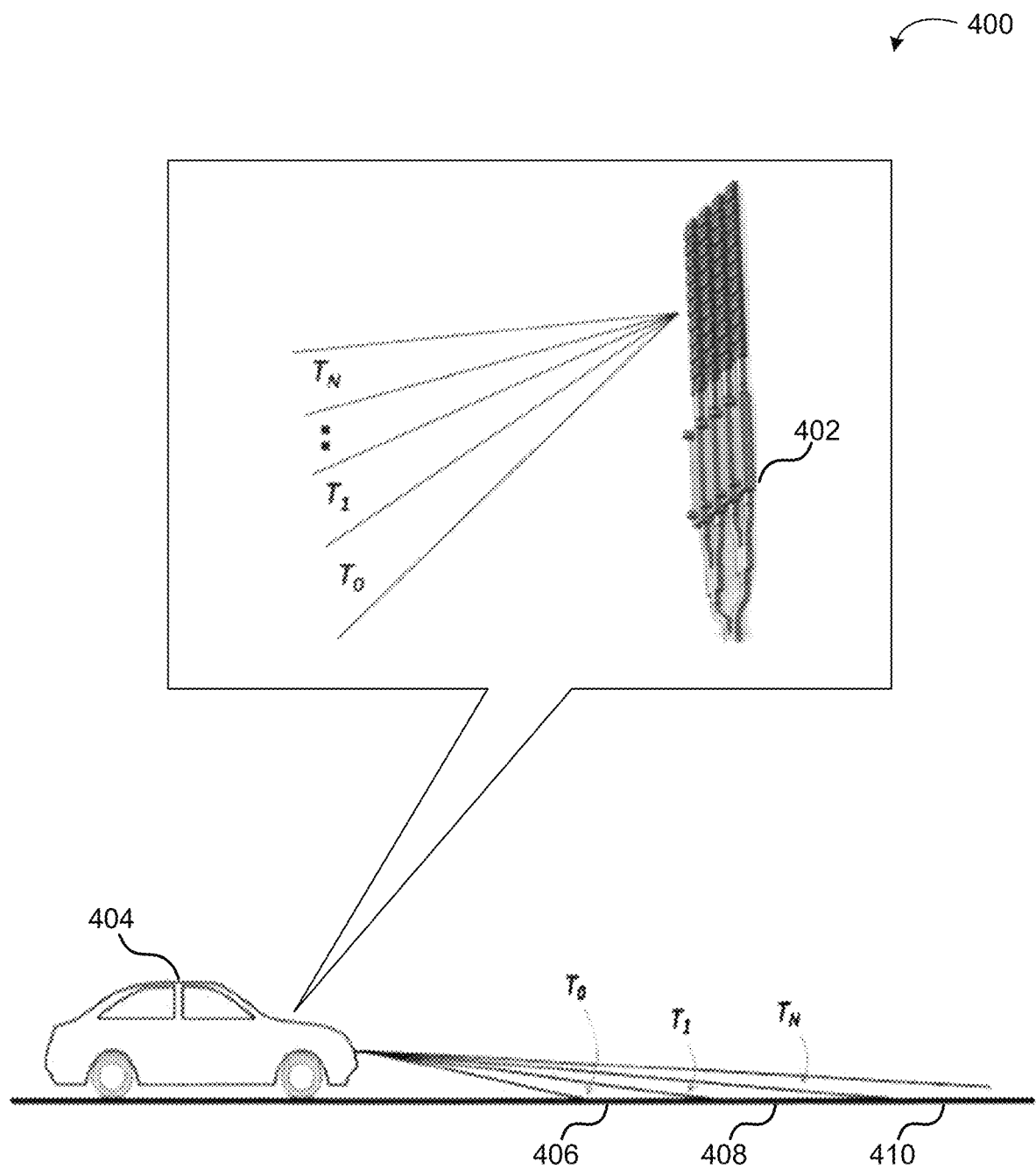
FIG. 4 illustrates an example vehicle using FMCW LIDAR for anomaly detection in accordance with various embodiments of the systems and methods disclosed herein.

FIG. 4 illustrates an example vehicle using FMCW LIDAR for anomaly detection in accordance with various embodiments of the systems and methods disclosed herein. With reference now to FIG. 4, the system 400 includes the optical grating array coupled with a vehicle 404. The different time periods correspond to different areas of road to be scanned. In each time period, the whole sector can be covered by the FMCW beam. Different sectors of the time periods 406 ($T_1$), 408 ($T_0$), and 410 ($T_N$) may have different lengths and the time sectors would correspond to different road sectors in front of the car.

Figure 5:
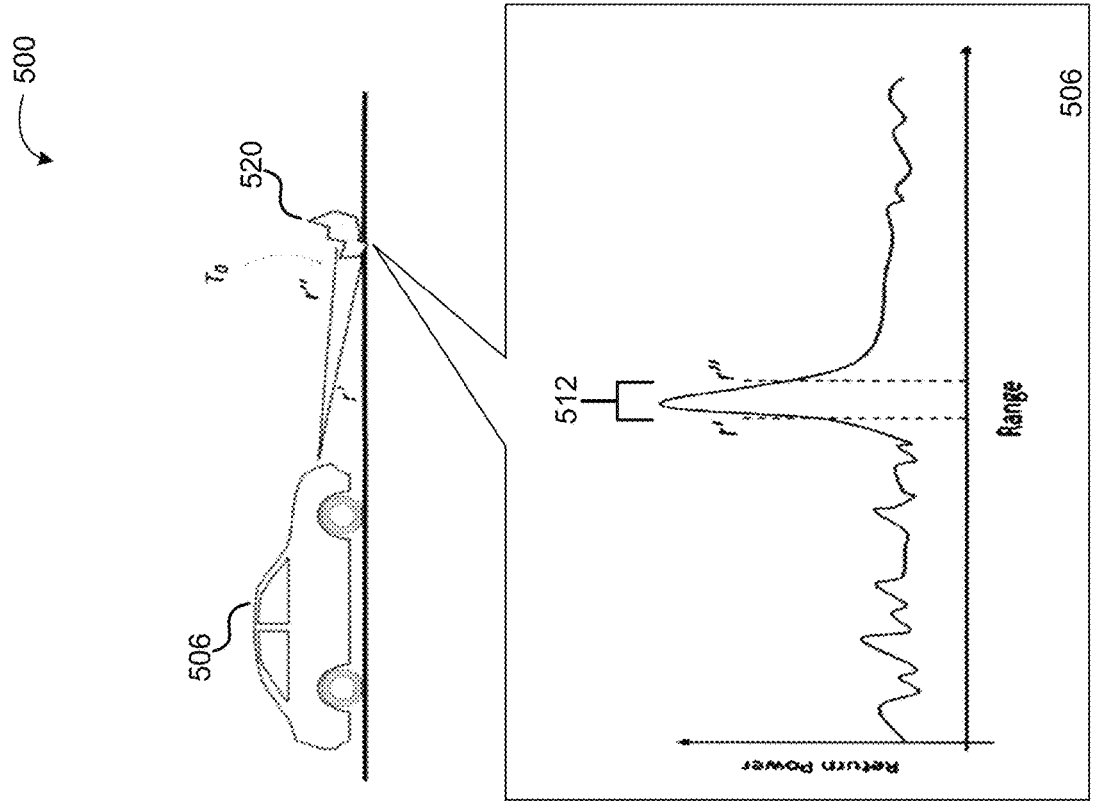
FIG. 5 illustrates an example vehicle applying FMCW LIDAR on various surfaces in accordance with various embodiments of the systems and methods disclosed herein.
Figure 5:
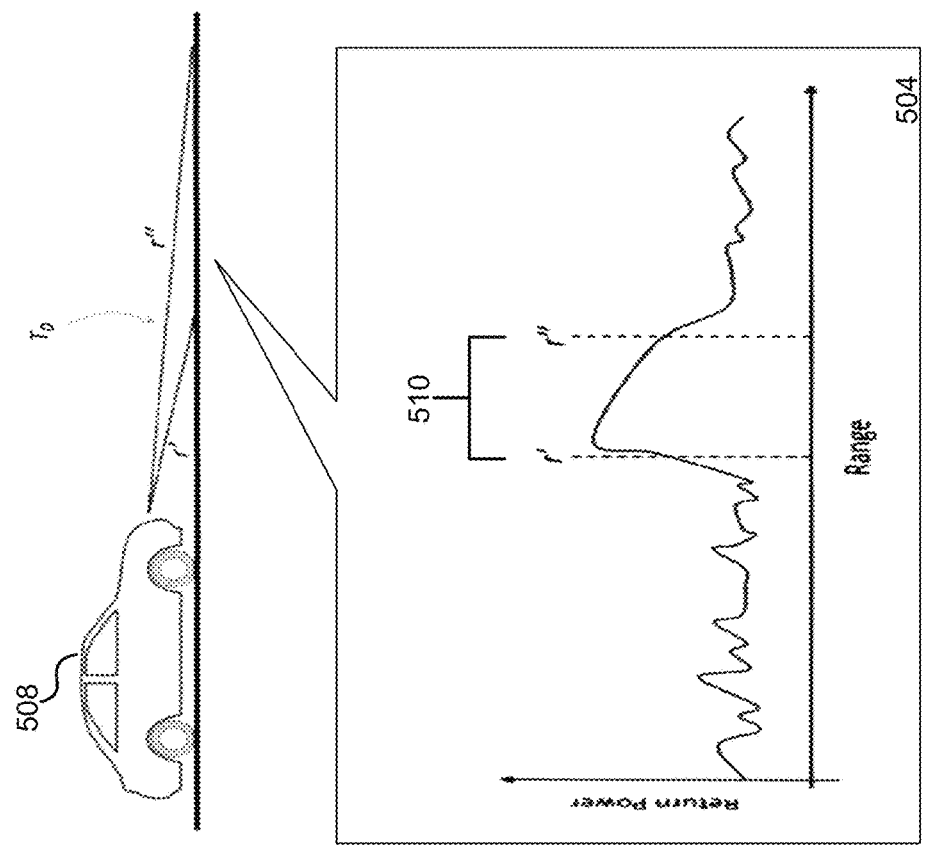

FIG. 5 illustrates an example vehicle applying FMCW LIDAR on various surfaces 500 in accordance with various embodiments of the systems and methods disclosed herein. With reference now to FIG. 5, a single time period is illustrated by a first length (r') and a second length (r"). The single time period illustrates where r' and r" may be at the extents of the range measurement. The different edges of the time period sector have different lengths, a first length (r') and a second length (r"). The lengths may be the same and different dependent on whether a path contains an anomaly. That is, lengths will be similar when an obstacle is within the transmitted optical signal and different when the road is flat (As shown in FIG. 5). The resulting FMCW power graph 504 over range after $T_0$ can be provided by Fast Fourier Transform. The power graph depicts the slope 510 of a clear flat road. Alternatively, power graph 506 provides a slope that indicates an object 520 was in the road. A comparison between the two graphs provides the basis for the presently disclosed technology.

Figure 6:
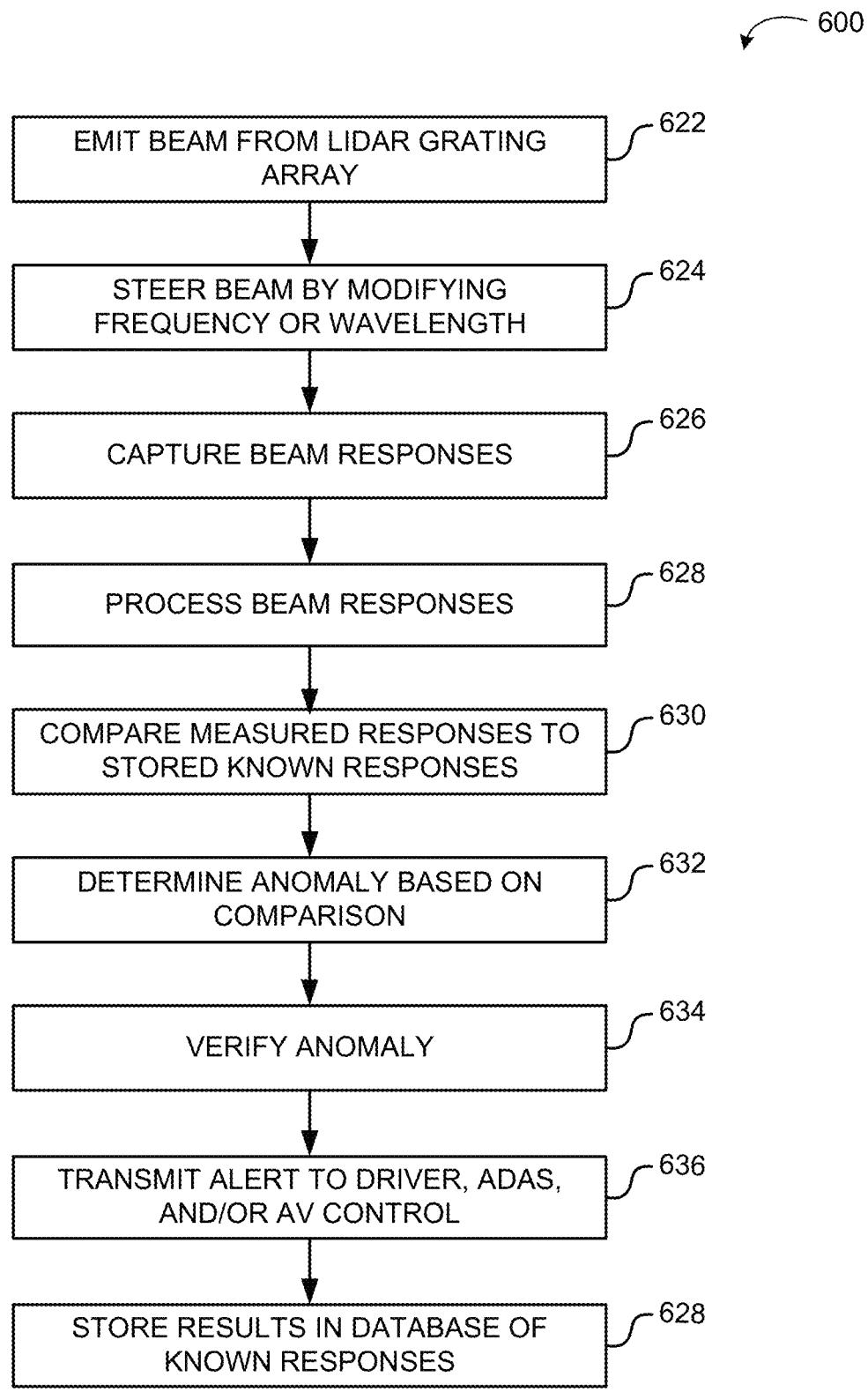
FIG. 6 illustrates an example process for anomaly detection in accordance with various embodiments of the systems and methods disclosed herein.

FIG. 6 illustrates an example process for anomaly detection 600 in accordance with various embodiments of the systems and methods disclosed herein. With reference now to FIG. 6, in operation 622, the LIDAR sensor emits a beam into the environment. The beam may be a continuous and/or effectively continuous wave emitted by a light source such as a laser. The characteristics of the light source can include a tunable output frequency, long-coherence (i.e., coherence length $2 \times R_{max}$), and a stable phase. Regarding the environment and direction of the emitted beam, the presently disclosed technology provides a road or path that may be generally coplanar with a vertical longitudinal plane of the vehicle. Stated differently, the horizontal plane of the path may be parallel to the horizontal plane of the vehicle. In other embodiments, the direction of the path may be relatively straight and have a nominal grade. In further still embodiments, the vehicle's forward direction and the path's forward direction may be parallel for at least the duration of the activation of the FMCW LIDAR system and/or the FMCW LIDAR detection can only be utilized or accessible when the horizontal planes of the path and system are substantially parallel. As to the latter situation, the additional sensors provided in FIG. 1 may be used if FMCW LIDAR detection becomes unavailable. It should be noted, that while the direction of the beam is substantially toward or in the forward direction of the vehicle while moving, the beam can still provide a wide angle fill or beam width such that an entire paths from highways to dirt trails can be scanned by the presently disclosed technology.

For example, a FMCW enables a coherent detection that opens many opportunities in signal processing. On the other hand, a pulsed beam is measured through direct detection. The classic time-of-flight LIDAR uses a pulsed beam to determine velocity and range of a target.

In operation 624, the beam is steered by the optical grating array. A chirp may be used for to enable a FMCW. The frequency (or wavelength) of the beam can be modulated or modified as a function of time. That is, the frequency is linearly increased from $T_0$ to $T_N$ as illustrated in FIG. 3. Additionally, the frequency of the beam may be modulated or modified to provide a predefined range of wavelengths corresponding to a particular time period. As discussed further above, each time period corresponds with a sector covering a particular range The optical grating array diffracts the optical inputs into a beam that is associated with a particular set of wavelengths. As the frequency is modified, the angle of the diffraction is also modified. Thus, a wide angle fill is provided by a solid-state component.

In operation 626, the reflected beam is detected by the LIDAR sensor. Detection may include a local oscillator and photodiodes, as described above. Notably, coherent detection is enabled which means there is a constant phase difference. This configuration enables a balanced photodetector and homodyne detection.

In operation 628, the detected beam is converted into electrical signals by a photodiode and directed to a computing unit of the LIDAR sensor. For example, computing unit 800 which is described further below. The computing unit receives the electrical data and applies a Fast Fourier Transform (FFT) on the electrical data. Prior to transformation, the voltage over time may be graphed indicating the time domain. A FFT converts the time domain to a frequency domain. In operation 630, the FMCW power graphs are the result of the transformation and scaling (i.e., FMCW processing). FMCW processing may further include integrating the entire sector (e.g., To) together so that all distances that exist between r' and r" could be identified in the FMCW power graph. These graphs represent FMCW power over range. The amplitude versus frequency graph was scaled by a factor (cT/2B) to provide amplitude (i.e., received power) versus range or a Range Profile where c=speed of light, T=chirp period, and B=chirp bandwidth. A range profile is based on a plot of the amplitude spectrum (not shown) plotted as a function of frequency, the abscissa can be scaled by a factor to yield a plot of target reflectivity versus range; this plot is called a range profile.

In operation 632, a comparison between the measured responses and known responses is performed by the computing unit. The known responses include a flat road without an anomaly while the measured responses depict possible anomalies. An example reference slope in shown in FIG. 3 in which a slope exists from a closer distance r' down to a farther distance r" for a scenario in which the road appears to be flat. t. farther The slope of known responses of the received power graphs can be compared to the slope of measured response of the received power graph which differ from the slope of known responses. The difference between slopes may be evaluated against a threshold. In some embodiments, additional signal processing techniques such as wavelet analysis and machine learns can be utilized to differentiate between slopes in the received power graphs or range profiles.

In operation 634, the anomaly is identified by the result of the slope comparison. The memory of the computing unit may access internal memory, external memory, or a remote database to receive slope data of reference or flat road graphs. The identified anomaly may also be verified by additional sensor modalities. For example, as illustrated in FIG. 1, sensors 120 may be used to confirm the existence of an anomaly or object via the sensor fusion component 131. In operation 636, the driver may be alerted as to the detected anomaly and/or the vehicle may perform various maneuvers automatically. For example, component 260 provides various routes that may be performed once the anomaly is detected.

Lastly, in operation 628, the results of the identified anomaly and associated waveform are stored in database of known responses. The database can be updated via new anomaly identifications. Thus the database may provide a comprehensive resource of known responses for retrieval in the future.

Figure 7:
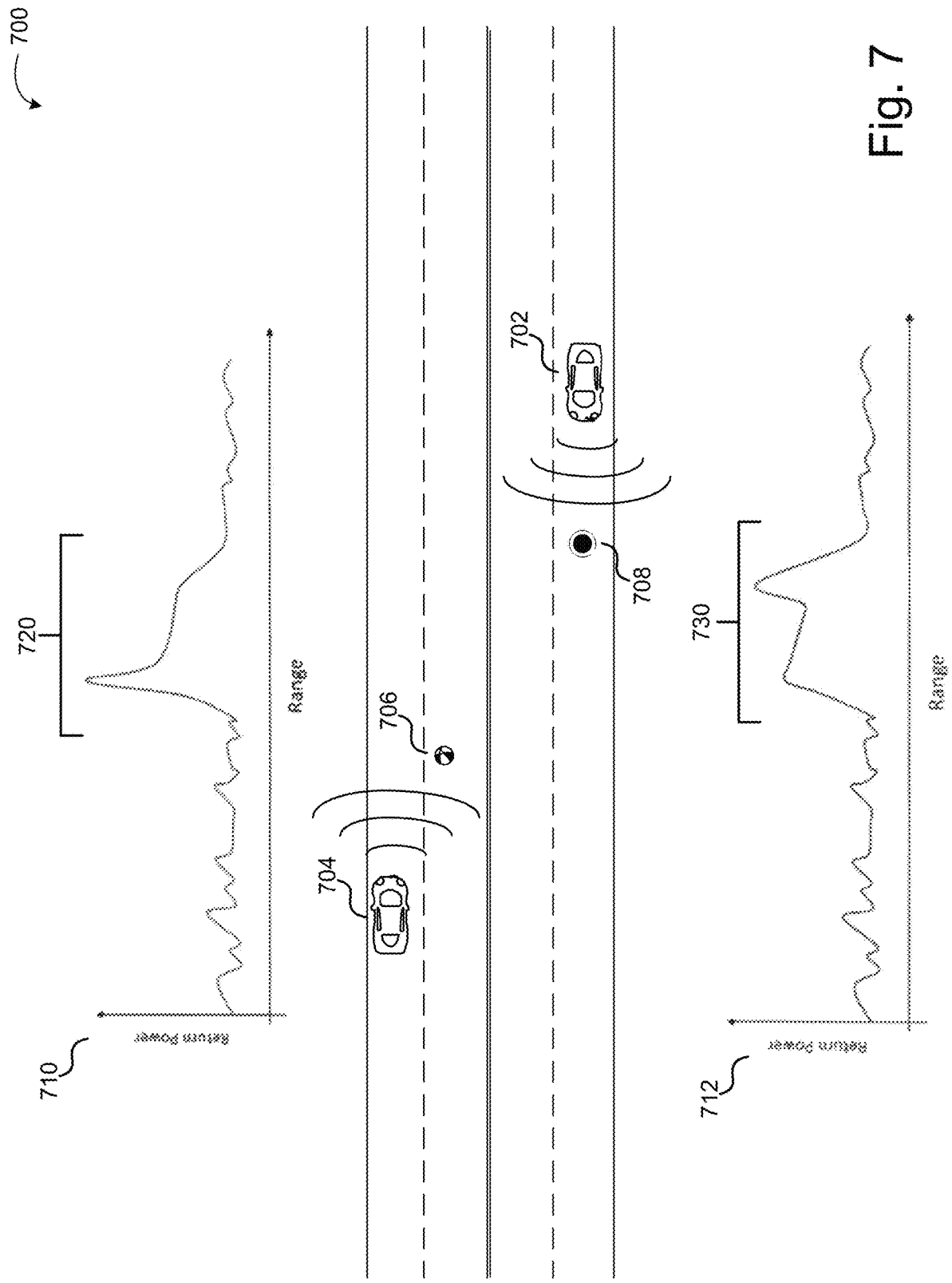
FIG. 7 illustrates an example implementation of FMCW LIDAR on a trafficked roadway in accordance with various embodiments of the systems and methods disclosed herein.

FIG. 7 illustrates an example implementation of FMCW LIDAR on a 700 trafficked roadway in accordance with various embodiments of the systems and methods disclosed herein. With reference now to FIG. 7, semi-autonomous or autonomous vehicles 702 and 704 provide an implementation of the presently disclosed technology in the real world. Vehicle 704 has detected a small object 706 in its path while Vehicle 702 has detected a pothole 708. Both the object 706 and pothole 708 can be considered anomalies. The resulting power graphs of the detected anomalies in shown in power graph 710 and power graph 712. The measured response from each object may be processed to determine the respective received power. Thereafter, the slopes of each power graph are compared to the baseline graph. For example, the slopes of power graph 710 and associated slope 720 and power graph 712 and associated slope 730 could be compared to the slope 510 of reference graph 504 in FIG. 5 to determine whether an anomaly exists of the path of the vehicle. In some embodiments, the comparison may use convolution or machine learning to differentiate between objects with similar measured responses.

Figure 8:
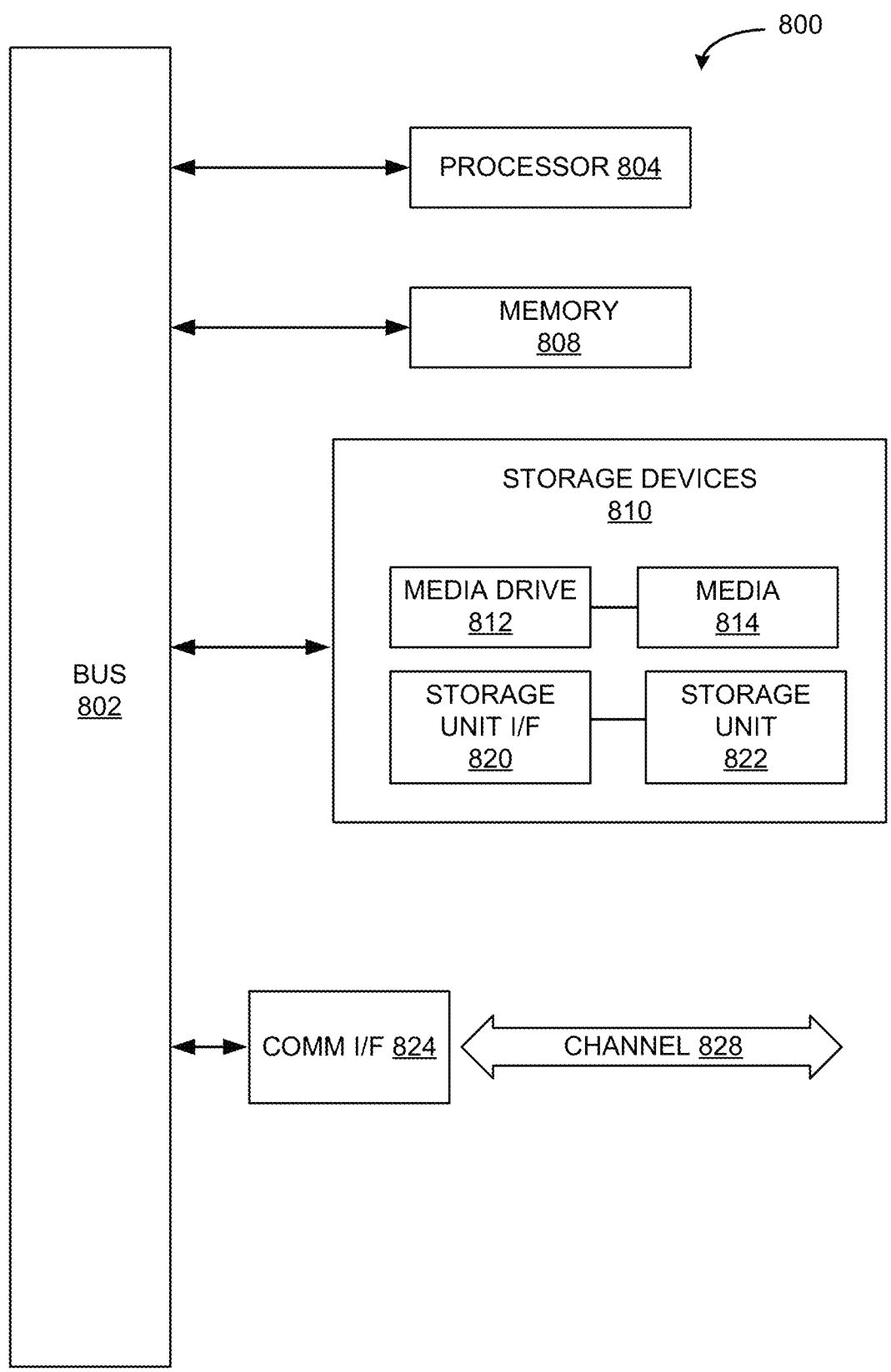
FIG. 8 is an example computing component that may be used to implement various features of embodiments described in the presently disclosed technology.

In various embodiments, a cost-saving measure can be incorporated to remove mechanical mechanisms for scanning side-to-side to map the surrounding environment; however, a wide angle fill can still be achieved to cover the area of the road using an optical grating array 402 as illustrated in FIG. 4. Further processing of the reflected light encompasses integrating all side-to-side angles together into the same FMCW power spectrum (i.e., received power graph). Based on the processed responses and subsequent comparison via a computing component 800, a small object or road debris would likely be present in received power graph or range profile 710 while the received power graph or range profile 712 demonstrates the existence of a negative object such as a pothole. A steep negative slope will indicate the presence of a hole or empty space in a flat road. That it, the transmitted beam bounded off an interior portion of the road, such as a hole, gap, crack, fissure, split, or crevice within the surface.

Where embodiments of the system are implemented in whole or in part using software, these software elements can be implemented to operate with a computing or processing component capable of carrying out the functionality described with respect thereto. One such example computing component is shown in FIG. 8. Various embodiments are described in terms of this example-computing component 800. After reading this description, it will become apparent to a person skilled in the relevant art how to implement the presently disclosed technology using other computing components or architectures.

Referring now to FIG. 8, computing component 800 may represent, for example, computing or processing capabilities found within a self-adjusting display, desktop, laptop, notebook, and tablet computers. They may be found in hand-held computing devices (tablets, PDA's, smart phones, cell phones, palmtops, etc.). They may be found in workstations or other devices with displays, servers, or any other type of special-purpose or general-purpose computing devices as may be desirable or appropriate for a given application or environment. Computing component 800 might also represent computing capabilities embedded within or otherwise available to a given device. For example, a computing component might be found in other electronic devices such as, for example, portable computing devices, and other electronic devices that might include some form of processing capability.

Computing component 800 might include, for example, one or more processors, controllers, control components, or other processing devices. Processor 804 might be implemented using a general-purpose or special-purpose processing engine such as, for example, a microprocessor, controller, or other control logic. Processor 804 may be connected to a bus 802. However, any communication medium can be used to facilitate interaction with other components of computing component 800 or to communicate externally.

Computing component 800 might also include one or more memory components, simply referred to herein as main memory 808. For example, random access memory (RAM) or other dynamic memory, might be used for storing information and instructions to be executed by processor 804. Main memory 808 might also be used for storing temporary variables or other intermediate information during execution of instructions to be executed by processor 804. Computing component 800 might likewise include a read only memory ("ROM") or other static storage device coupled to bus 802 for storing static information and instructions for processor 804.

The computing component 800 might also include one or more various forms of information storage mechanism 810, which might include, for example, a media drive 812 and a storage unit interface 820. The media drive 812 might include a drive or other mechanism to support fixed or removable storage media 814. For example, a hard disk drive, a solid-state drive, a magnetic tape drive, an optical drive, a compact disc (CD) or digital video disc (DVD) drive (R or RW), or other removable or fixed media drive might be provided. Storage media 814 might include, for example, a hard disk, an integrated circuit assembly, magnetic tape, cartridge, optical disk, a CD or DVD. Storage media 814 may be any other fixed or removable medium that is read by, written to or accessed by media drive 812. As these examples illustrate, the storage media 814 can include a computer usable storage medium having stored therein computer software or data.

In alternative embodiments, information storage mechanism 810 might include other similar instrumentalities for allowing computer programs or other instructions or data to be loaded into computing component 800. Such instrumentalities might include, for example, a fixed or removable storage unit 822 and an interface 820. Examples of such storage units 822 and interfaces 820 can include a program cartridge and cartridge interface, a removable memory (for example, a flash memory or other removable memory component) and memory slot. Other examples may include a PCMCIA slot and card, and other fixed or removable storage units 822 and interfaces 820 that allow software and data to be transferred from storage unit 822 to computing component 800.

Computing component 800 might also include a communications interface 824. Communications interface 824 might be used to allow software and data to be transferred between computing component 800 and external devices. Examples of communications interface 824 might include a modem or softmodem, a network interface (such as Ethernet, network interface card, IEEE 802.XX or other interface). Other examples include a communications port (such as for example, a USB port, IR port, RS232 port Bluetooth® interface, or other port), or other communications interface. Software/data transferred via communications interface 824 may be carried on signals, which can be electronic, electromagnetic (which includes optical) or other signals capable of being exchanged by a given communications interface 824. These signals might be provided to communications interface 824 via a channel 828. Channel 828 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to transitory or non-transitory media. Such media may be, e.g., memory 808, storage unit 820, media 814, and channel 828. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing component 800 to perform features or functions of the presently disclosed technology as discussed herein.

It should be understood that the various features, aspects and functionality described in one or more of the individual embodiments are not limited in their applicability to the particular embodiment with which they are described. Instead, they can be applied, alone or in various combinations, to one or more other embodiments, whether or not such embodiments are described and whether or not such features are presented as being a part of a described embodiment. Thus, the breadth and scope of the presently disclosed technology should not be limited by any of the above-described exemplary embodiments.

Terms and phrases used in this document, and variations thereof, unless otherwise expressly stated, should be construed as open ended as opposed to limiting. As examples of the foregoing, the term "including" should be read as meaning "including, without limitation" or the like. The term "example" is used to provide exemplary instances of the item in discussion, not an exhaustive or limiting list thereof. The terms "a" or "an" should be read as meaning "at least one," "one or more" or the like; and adjectives such as "conventional," "traditional," "normal," "standard," "known." Terms of similar meaning should not be construed as limiting the item described to a given time period or to an item available as of a given time. Instead, they should be read to encompass conventional, traditional, normal, or standard technologies that may be available or known now or at any time in the future. Where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "component" does not imply that the aspects or functionality described or claimed as part of the component are all configured in a common package. Indeed, any or all of the various aspects of a component, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of the presently disclosed technology, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method for anomaly detection using a light detection and ranging (LIDAR) sensor comprising:
   generating a wide-angle laser emission via an optical grating array;
   detecting a reflected signal of the wide-angle laser emission, wherein the detected wide-angle laser emission comprises a measured representation;
   retrieving a stored detected wide-angle laser emission, wherein the stored detected wide-angle laser emission comprises a baseline representation;
   comparing the measured representation to the baseline representation by processing the reflected signal of the wide-angle laser emission by a Fast Fourier algorithm and convolving the processed reflected signal with the retrieved stored detected wide-angle laser emission; and
   identifying an anomaly based on the processed signals depicting received power representations unique to the anomaly identified, the identification corresponding to the comparison between a first slope of the baseline representation and a second slope of the measured representation, the anomaly representing an impediment in a travel path.

2. The method of claim 1, further comprising:
   steering the generated wide-angle laser emission via the optical grating array of the LIDAR sensor, the steering comprises modulating a wavelength of the generated wide-angle laser emission, wherein a plurality of wavelength ranges as applied to the optical grating array correspond to a plurality of locations in the travel path and a plurality of time periods.

3. The method of claim 1, further comprising:
   providing a notification of the identified anomaly, wherein the identified anomaly comprises at least one of: road debris, a pothole, a large object, a small object, a cracked surface, or construction.

4. The method of claim 1, further comprising:
   mounting the LIDAR sensor to a vehicle;
   accessing a slope database to identify the anomaly detected by the LIDAR, wherein the database is a remote data store or internal memory; and
   presenting the identified anomaly in the travel path to an occupant in the vehicle and activating automated maneuvers of the vehicle corresponding to the identified anomaly.

5. The method of claim 1, wherein the generated wide-angle laser emission comprises a frequency-modulated continuous-wave (FMCW) directed to the travel path approximately in from of a moving vehicle and the optical grating array steers the wide-angle laser emission.

6. The method of claim 2, wherein the comparison further comprises weighing the comparison between the first slope of the baseline representation and the second slope of the measured representation against a threshold, the threshold indicating a dissimilarity between the first and the second slope.

7. The method of claim 1, wherein convolving the processed reflected signal with the retrieved stored detected wide-angle laser emission comprises:
   transforming the baseline representation and the measured representation into a first set of waveforms and a second set of waveforms;
   convolving the first set of waveforms and the second set of waveforms; and
   comparing a resulting waveform to a threshold to identify the anomaly.

8. The method of claim 7, wherein comparing further comprises detecting a waveform difference by applying a machine learning algorithm or wavelet analysis.

9. The method of claim 1 further comprising:
   restricting the wide-angle laser emission to steering angles of the optical grating array; and
   fusing data from the LIDAR sensor to verify the identified anomaly, wherein the sensor data comprises vehicle camera data and the LIDAR sensor data.

10. The method of claim 2, wherein steering the generated wide-angle laser emission further comprises generating the wide-angle emission using a distributed feedback laser and modulating a frequency modulation scheme via a frequency tuner that controls the wavelength inputted into the optical grating array.

11. A system comprising:
   a light source configured to emit a beam of light, wherein the light source comprises a tunable output wavelength and a stable phase;
   a sensor configured to transmit the beam of light and detect a reflected beam of light, wherein the sensor comprises a photodetector and an optical grating array configured to diffract the beam of light based on a wavelength of the beam of light;
   a modulator configured to modulate the wavelength of the light source, wherein sets of different wavelength ranges are configured to be directed to the optical grating array and each set of different wavelength ranges corresponds to a steering angle; and a computing component configured to receive the detected reflected beam of light and retrieve a stored representation of a separate beam of light, wherein the computing component processes the detected reflected beam of light by a Fast Fourier algorithm to identify an anomaly by convolving a computed representation of the detected reflected beam of light with the stored representation of the separate beam of light, the identification being made based on the processed signals depicting received power representations unique to the anomaly identified, the identification corresponding to a comparison between a first slope of the stored representation and a second slope of the computed representation.

12. The system of claim 11, further comprising:

the beam of light comprising a continuous wave modulated by a frequency tuner, wherein modulation of the continuous wave changes a steering angle of the continuous wave.

13. The system of claim 11, further comprising:

a photonic integrated circuit configured to interconnect the light source, the sensor, the modulator, and the computing component, wherein the sensor further comprises a local oscillator and a PIN photodiode for coherent detection.

14. The system of claim 11, wherein the computing component further comprises:

a measured power graph comprising a slope depicting a surface and the anomaly, wherein the measured power graph is a Fast Fourier Transform derived from predetermined frequency components of the emitted beam of light;

a known power graph comprising a slope depicting a surface without the anomaly, wherein the known power graph is a Fast Fourier Transform derived from predetermined frequency components of a known emitted beam of light; and the computing component comparing the measured power graph and the known power graph to identify the anomaly.

15. The system of claim 14, further comprising:

providing a notification concerning the identified anomaly, wherein the identified anomaly comprises at least one of road debris, a hole, a small object, a large object, a cracked surface, a road impediment, or a construction zone.

16. A non-transitory machine-readable medium having instructions stored therein, which when executed by a processor, cause the processor to perform operations, the operations comprising:

generating a baseline graph of received power with respect to distance of a flat road;

generating an operational graph of received power with respect to distance of a flat road, wherein a linear slope of the baseline graph and the operational graph depict a distribution with a linear slope from a greater received power, reflected from a nearer point associated with a higher wavelength, to a lesser received power reflected from a further point associated with a lower wavelength;

comparing the linear slope of the baseline graph and the linear slope of the operational graph, wherein the linear slope of the operational graph is different from the linear slope of the baseline graph; and identifying an anomaly based on the comparison of the operational graph to the baseline graph.

17. The machine-readable medium of claim 16, further comprising:

verifying the identified anomaly using an additional sensor in the moving vehicle, wherein the additional sensor is a camera.

18. The machine-readable medium of claim 16, wherein the baseline graph and the operational graph comprise measured responses from a light detection and ranging (LIDAR) sensor, wherein an outputted optical signal of the LIDAR sensor is a continuous wave optical signal controlled by an optical grating array.

19. The machine-readable medium of claim 18, wherein the optical grating array comprises a first set of optical antennas for transmitting the continuous wave optical signal and a second set of receiving optical antennas for receiving a reflected continuous wave optical signal.

20. The machine-readable medium of claim 16, wherein the baseline graph and operational graph further comprise:

measured responses transformed by a Fast Fourier algorithm, wherein the transformed measured responses indicate received power as a function of wavelength and distance.

* * * * *